(12) United States Patent
Rao

(10) Patent No.: US 8,354,871 B2
(45) Date of Patent: Jan. 15, 2013

(54) SELF-POWERED COMPARATOR

(75) Inventor: Yuan Rao, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 127 days.

(21) Appl. No.: 12/942,768

(22) Filed: Nov. 9, 2010

(65) Prior Publication Data

US 2011/0109347 A1    May 12, 2011

Related U.S. Application Data

(60) Provisional application No. 61/259,448, filed on Nov. 9, 2009.

(51) Int. Cl.
*H02M 7/217* (2006.01)

(52) U.S. Cl. .................................... 327/330; 363/127

(58) Field of Classification Search .................. None
See application file for complete search history.

(56) References Cited

U.S. PATENT DOCUMENTS

| | | | |
|---|---|---|---|
| 5,099,302 A | 3/1992 | Pavlin | |
| 6,060,943 A * | 5/2000 | Jansen | 327/538 |
| 6,469,564 B1 * | 10/2002 | Jansen | 327/365 |
| 6,501,320 B1 * | 12/2002 | Le | 327/330 |
| 6,747,880 B2 * | 6/2004 | Grover | 363/21.06 |
| 6,781,804 B1 | 8/2004 | Claverie | |
| 7,009,314 B2 * | 3/2006 | Chen | 307/130 |
| 7,199,636 B2 | 4/2007 | Oswald et al. | |
| 7,331,803 B2 | 2/2008 | Steigerwald et al. | |
| 7,429,805 B2 | 9/2008 | Hamel et al. | |
| 2007/0141874 A1 | 6/2007 | Steigerwald et al. | |

FOREIGN PATENT DOCUMENTS

| | | |
|---|---|---|
| WO | WO-97/24795 A1 | 7/1997 |
| WO | WO-2005/064793 A1 | 7/2005 |
| WO | WO-2007/055265 A1 | 5/2007 |

OTHER PUBLICATIONS

Cheng, S., "Modeling of Magnetic Vibrational Energy Harvesters Using Equivalent Circuit Representations," *Journal of Micromechanics and Microengineering*, Nov. 2007, pp. 2328-2335, vol. 17, No. 11.

Liu, Y., et al., "Active Piezoelectric Energy Harvesting: General Principle and Experimental Demonstration," *Journal of Intelligent Material Systems and Structures*, Mar. 2009, pp. 575-585, vol. 20, No. 5.

Maurath, D., et al., "Highly Efficient Integrated Rectifier and Voltage Boosting Circuits for Energy Harvesting Applications," *Advanced in Radio Science*, 2008, pp. 219-225, vol. 6.

(Continued)

*Primary Examiner* — Patrick O'Neill

(74) *Attorney, Agent, or Firm* — Saliwanchik, Lloyd & Eisenschenk

(57) ABSTRACT

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

12 Claims, 9 Drawing Sheets

OTHER PUBLICATIONS

Texas Instruments, "Energy harvesting becomes reality with AdaptivEnergy's wireless, remote sensing solution based on TI ultra-low power technology," Texas Instruments NewsCenter, Aug. 19, 2008, http://newscenter.ti.com/Blogs/newsroom/archive/2008/08/19/energy-harvesting-becomes-reality-with-adaptivenergy-s-wireless-remote-sensing-solution-based-on-ti-ultra-low-power-technology-sc08102.aspx.

Sze, N.-M., et al. "Integrated Single-Inductor Dual-Input Dual-Output Boost Converter for Energy Harvesting Applications," 2008 IEEE International Symposium on Circuits and Systems, May 18-21, 2008, Seattle, WA, pp. 2218-2221.

Vullers, R.J.M., et al., "Micropower Energy Harvesting," *Solid-State Electronics*, Jul. 2009, pp. 684-693, vol. 53, No. 7.

\* cited by examiner

SELF-POWERED COMPARATOR

CROSS-REFERENCE TO RELATED APPLICATION(S)

The present application claims the benefit of U.S. Provisional patent application No. 61/259,448, filed Nov. 9, 2009, which is hereby incorporated by reference herein in entirety, including any figures, tables, and drawings.

BACKGROUND OF INVENTION

Existing active diodes used in energy harvester systems often have a comparator in an active rectifier that is powered either by an external power supply or by an energy storage element used to store the harvested energy. The energy storage element can be, for example, a battery or a capacitor. For systems that power the comparator via the energy storage element, the comparator often consumes power from the energy storage element even when the system is not harvesting any energy from the input (energy harvester). By consuming power from the energy storage element when the system is not harvesting energy, the energy storage element can be unnecessarily drained and potentially not sufficiently charged when needed. In order for the comparator to draw power from the energy storage element, the energy storage element needs to have sufficient charge to power the comparator. Accordingly, for systems where the comparator is powered by the energy storage element, the interval between two consecutive charging cycles should not be long enough for the comparator to drain the energy storage element to a point that the energy storage element no longer has sufficient energy to power the comparator, in order for the system to function properly.

BRIEF SUMMARY

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

Accordingly, the input can be used as a power supply for the comparator, which can reduce, or eliminate, the stand-by power used when the input is zero, too low in power to be harvested, or meets other criteria. Embodiments of the subject energy harvester system can eliminate the need for pre-charging, have greater efficiency, and allow for indefinitely long intervals between charging cycles.

DETAILED DISCLOSURE

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

Accordingly, the input can be used as a power supply for the comparator, which can reduce, or eliminate, the stand-by power used when the input is zero, too low in power to be harvested, or meets other criteria. Embodiments of the subject energy harvester system can eliminate the need for pre-charging, have greater efficiency, and allow for indefinitely long intervals between charging cycles.

Figure 1:
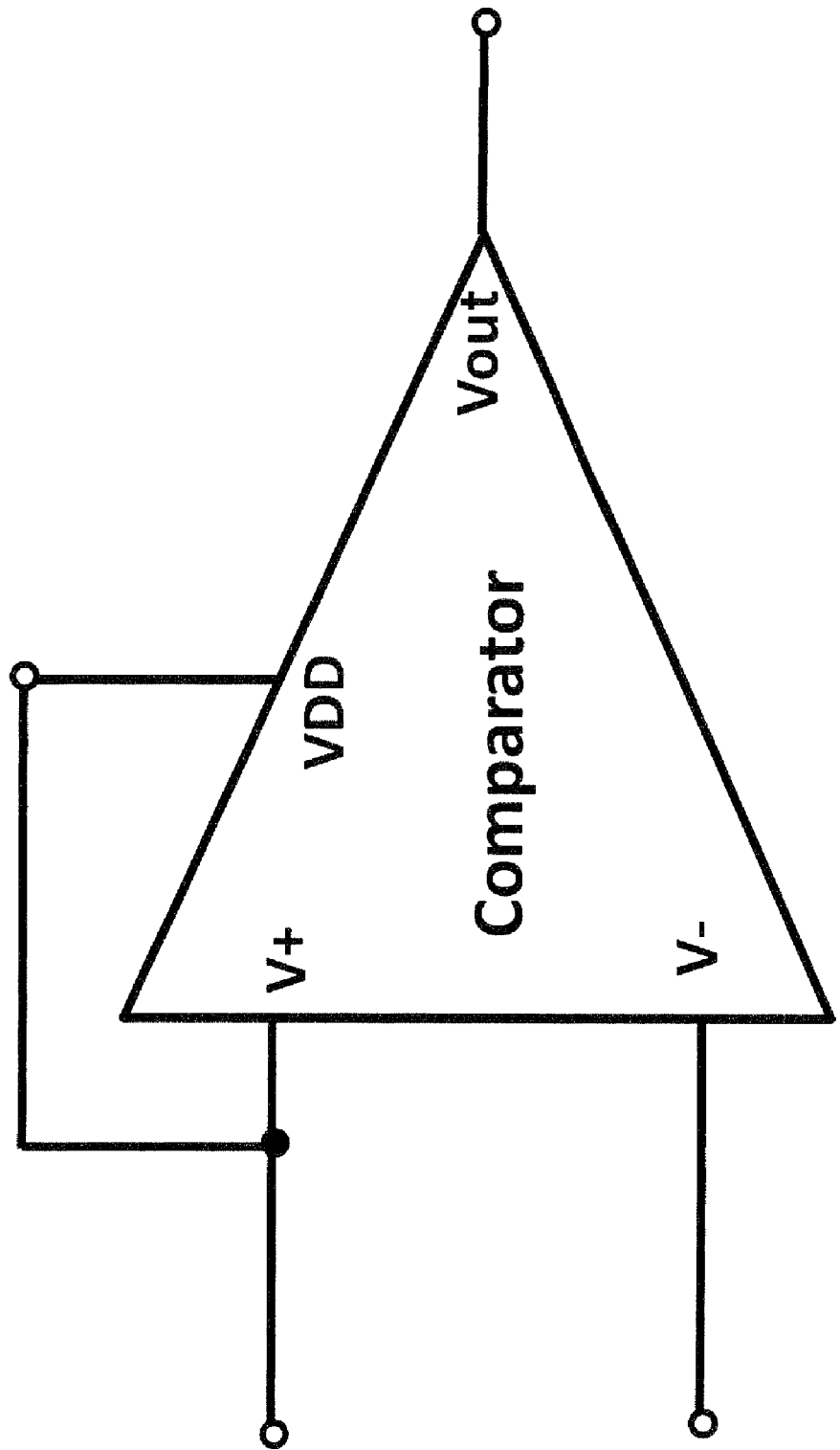
FIG. 1 shows a self-powered voltage comparator in accordance with an embodiment of the subject invention.

FIG. 1 shows a self-powered voltage comparator in accordance with an embodiment of the subject invention. The comparator has two input pins (V+, V−), one power supply pin (VDD), and one output pin (Vout). There need not be a separate power supply for the comparator as the comparator is powered, if needed, by the input. The power supply pin is connected with one of the input pins (V+) such that the comparator is supplied power via the V+ input pin. When the voltage at V+ is greater than at V−, Vout is low, e.g., a zero voltage. When the voltage of V+ is less than the voltage at V−, Vout is high. In an alternative embodiment, this pattern for Vout can be reversed such that Vout is high when V+ is greater than V− and Vout is low when V+ is less than V−. An energy harvester, or other input, can be connected to V+ such that the energy harvester can turn on the comparator and power the comparator. In a specific input, the energy storage element of the energy harvester system is connected to V−, such as a capacitor of an energy storage element.

Figure 2A:
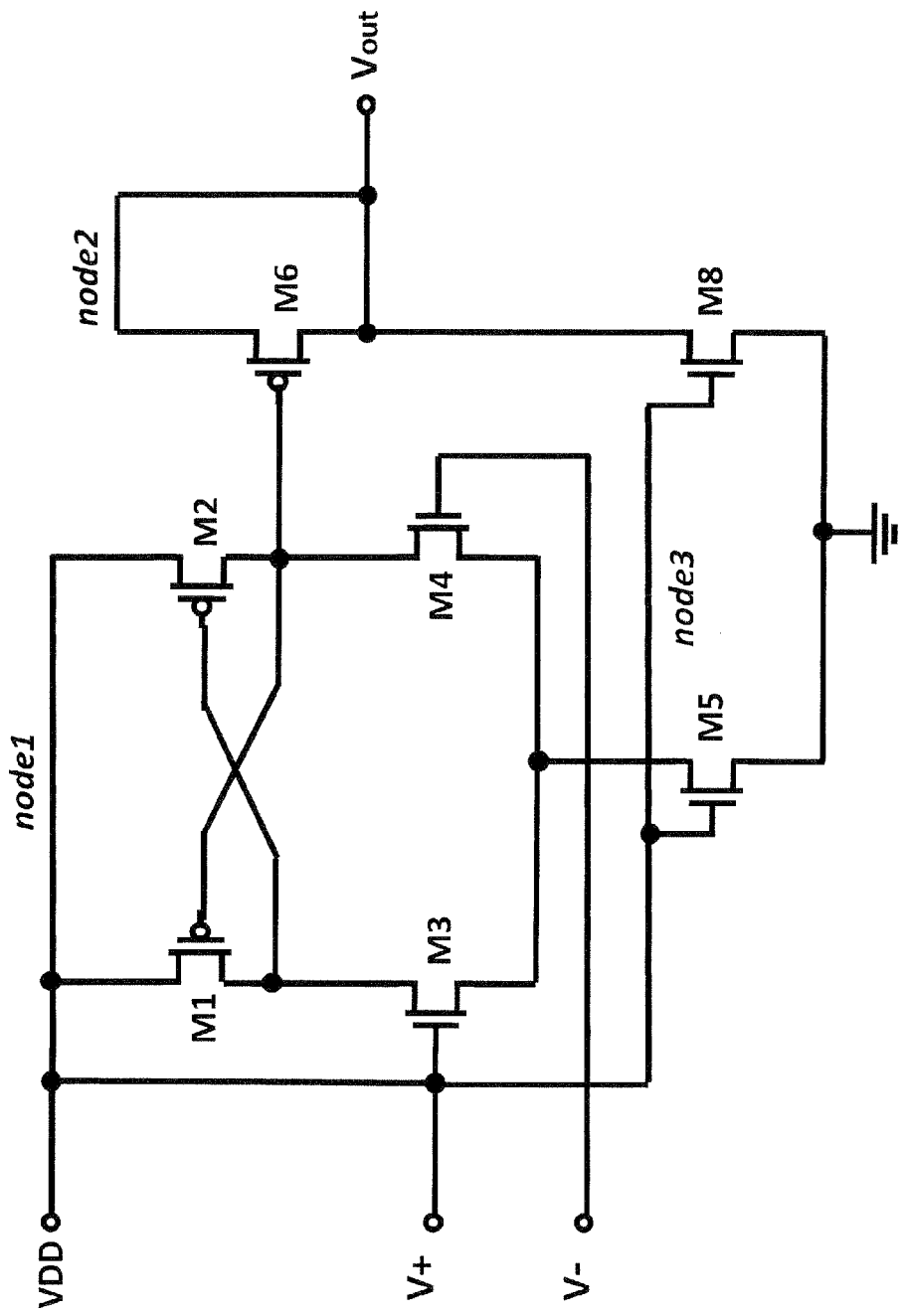
FIG. 2A shows a schematic of an embodiment of the input-powered voltage comparator of FIG. 1.
Figure 2B:
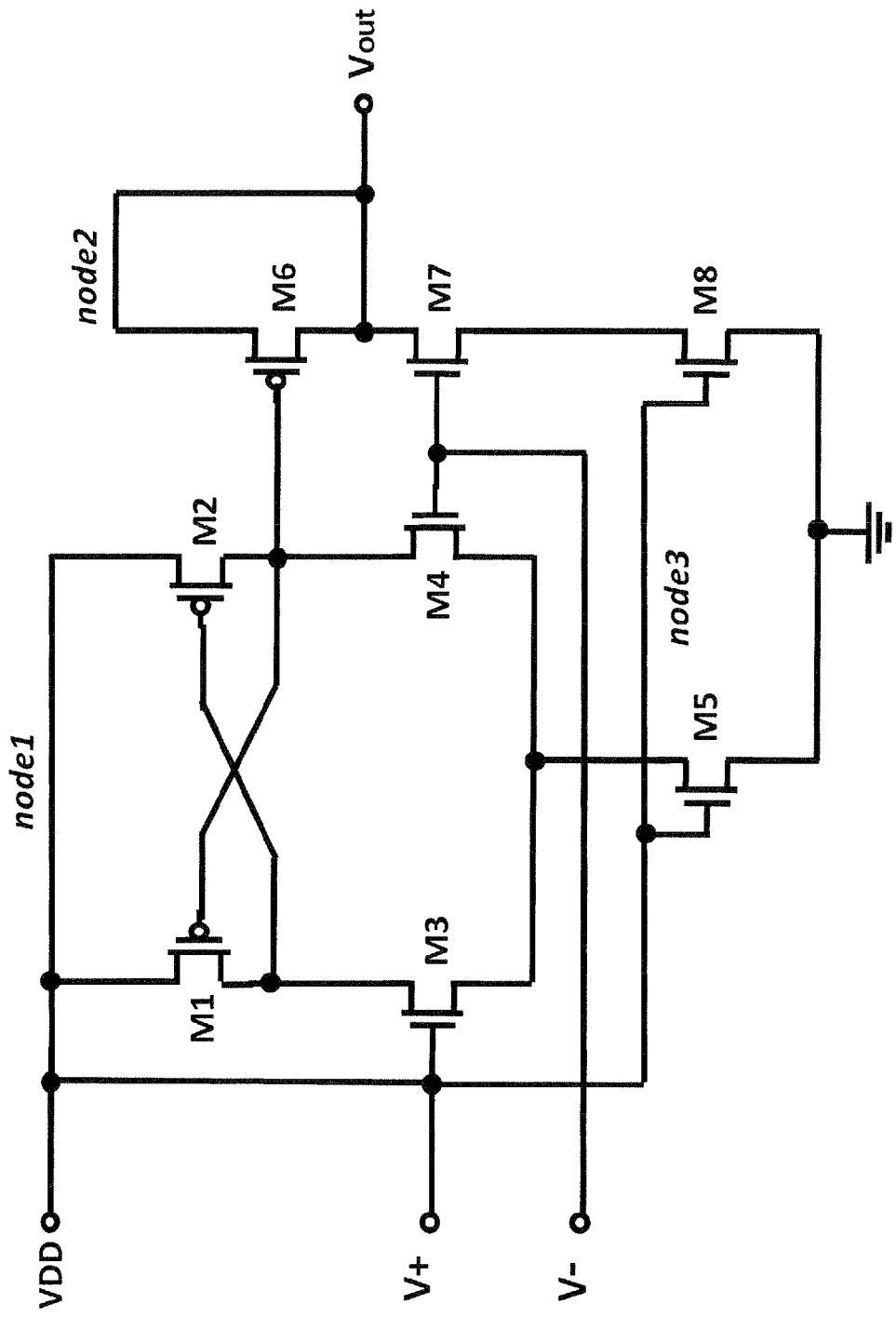
FIG. 2B shows a schematic of a specific embodiment of the input-powered voltage comparator of FIG. 1 with reduced offset.

Two schematics of the comparator of FIG. 1 are shown in FIGS. 2A-2B, where both of the schematics are functional circuits verified by simulation. FIG. 2B shows a schematic of a comparator with less offset than comparator represented by the schematic of FIG. 2A. The schematic of FIG. 2B can be considered to have two stages. The first stage includes a differential transistor pair (M3, M4) and a latch (M1, M2). The second stage is basically an inverter (M6, M8) with M7 added to reduce the comparator offset. The first stage's power supply (node1) connects to input (V+). The second stage's power supply (node2) connects to the output (Vout). Bias voltage (node3) for both stages is provided by input (V+).

When used in an energy harvester system in a specific embodiment, V− can be connected to a capacitor of the energy storage element. The voltage can be brought to node 1 and node 3 via separate electrical connectors connected to the input and/or V+. In a further specific embodiment, the inverter (M6, M8) and/or M7 can be removed and the input to the gate of M6 can be the output of the comparator. Such an embodiment can have an inverted Vout profile and may not have the same range of output voltages, and, therefore, may not be as desirable, as the inverter (M6, M8) also rectifies the output voltage and increase the voltage range.

Figure 3A:
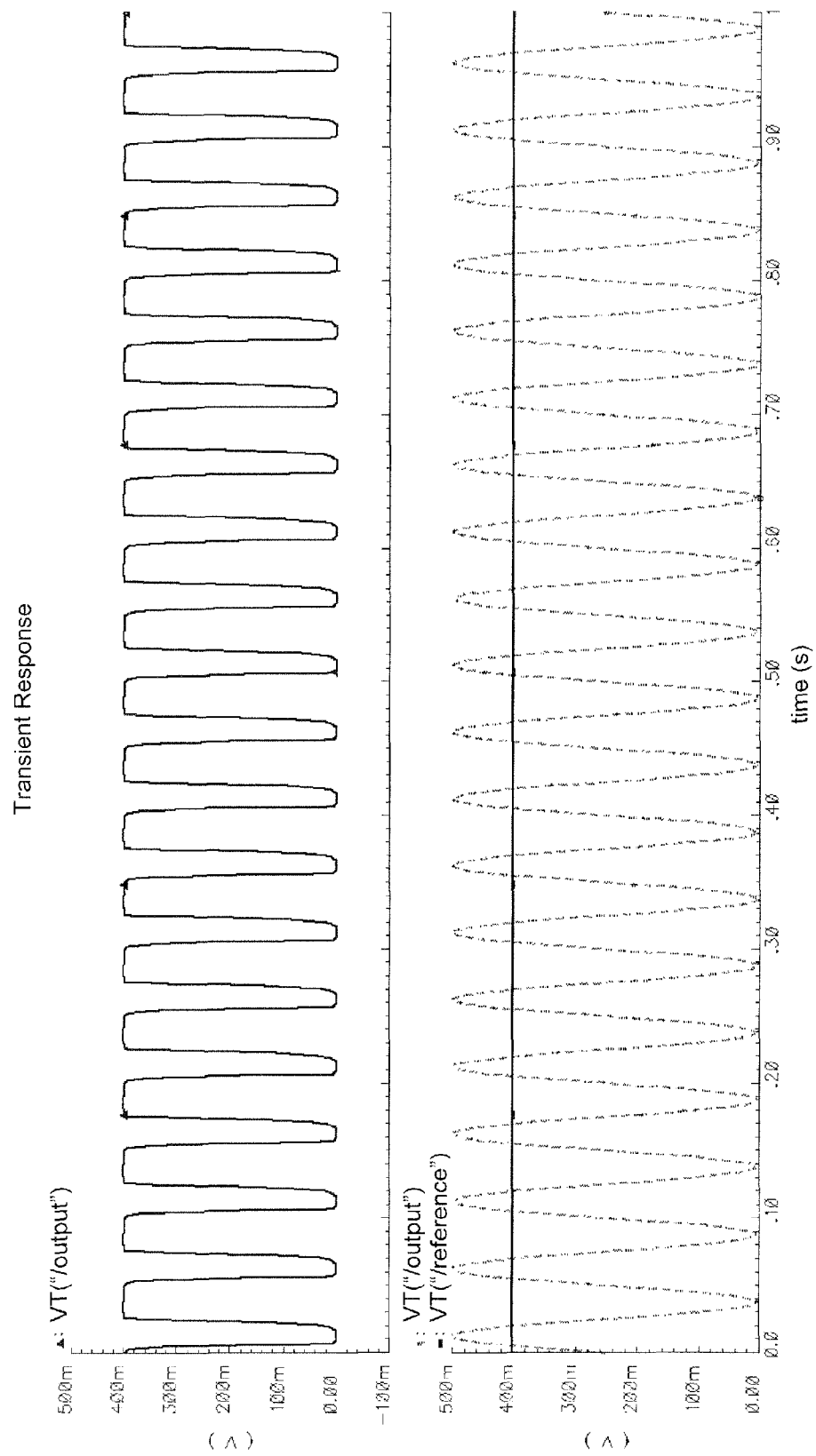
FIG. 3A shows a simulation result for the circuit shown in FIG. 2B, when V+=500 mVpp Sinwave, Vref=400 mV.
Figure 3B:
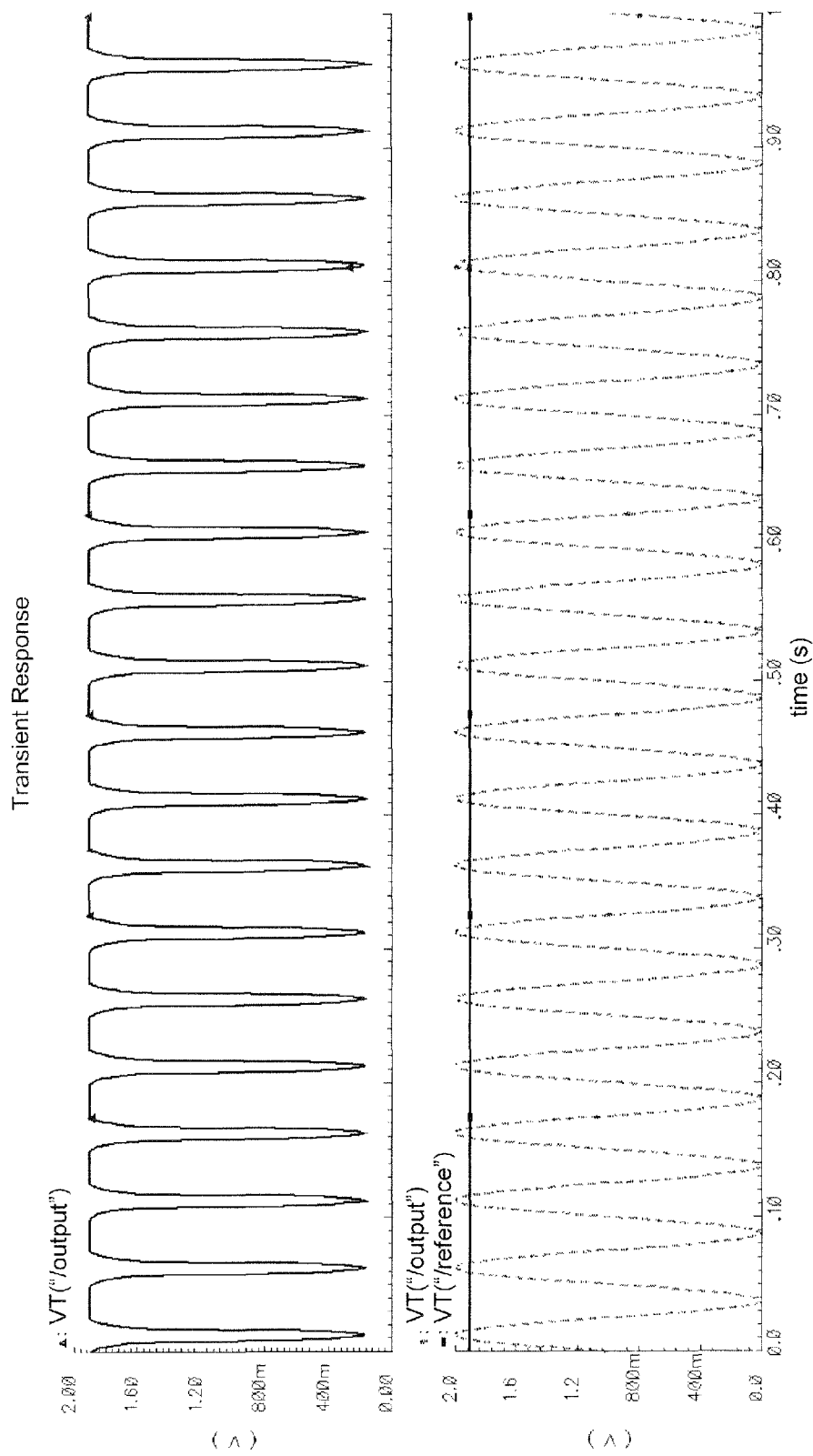
FIG. 3B shows a simulation result for the circuit shown in FIG. 2B, when V+=2Vpp Sinewave, Vref=1.9V.

The circuit can be built on CMOS technology. In an embodiment, all of the transistors are CMOS transistors. In alternative embodiments, other types of transistors can be utilized to implement the comparator. A specific CMOS circuit was simulated with AMI 0.6 um process model. The simulation indicates the circuit functions correctly with input voltage varying from 400 mV to 2.0V, as shown in FIG. 3A and FIG. 3B. The circuit uses technology scalable in other processes. For example, with scaled transistors' width and length, the circuit works in simulation with a CMOS 0.35 um and 0.13 um process model. The circuit is also fabricated as a chip using Onsemi 0.5 um process and the chip works as the simulation result.

Figure 4A:
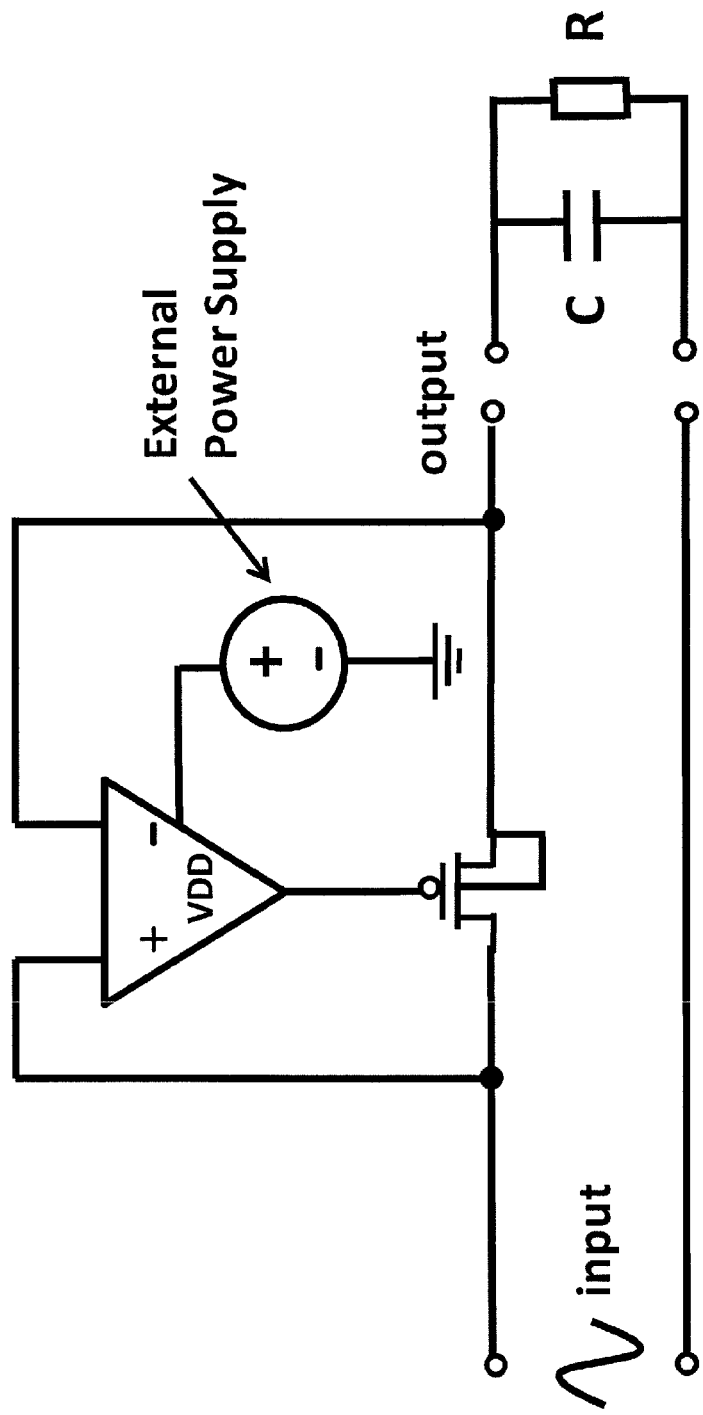
FIG. 4A shows a schematic of a commonly used external-powered active diode circuit.
Figure 4B:
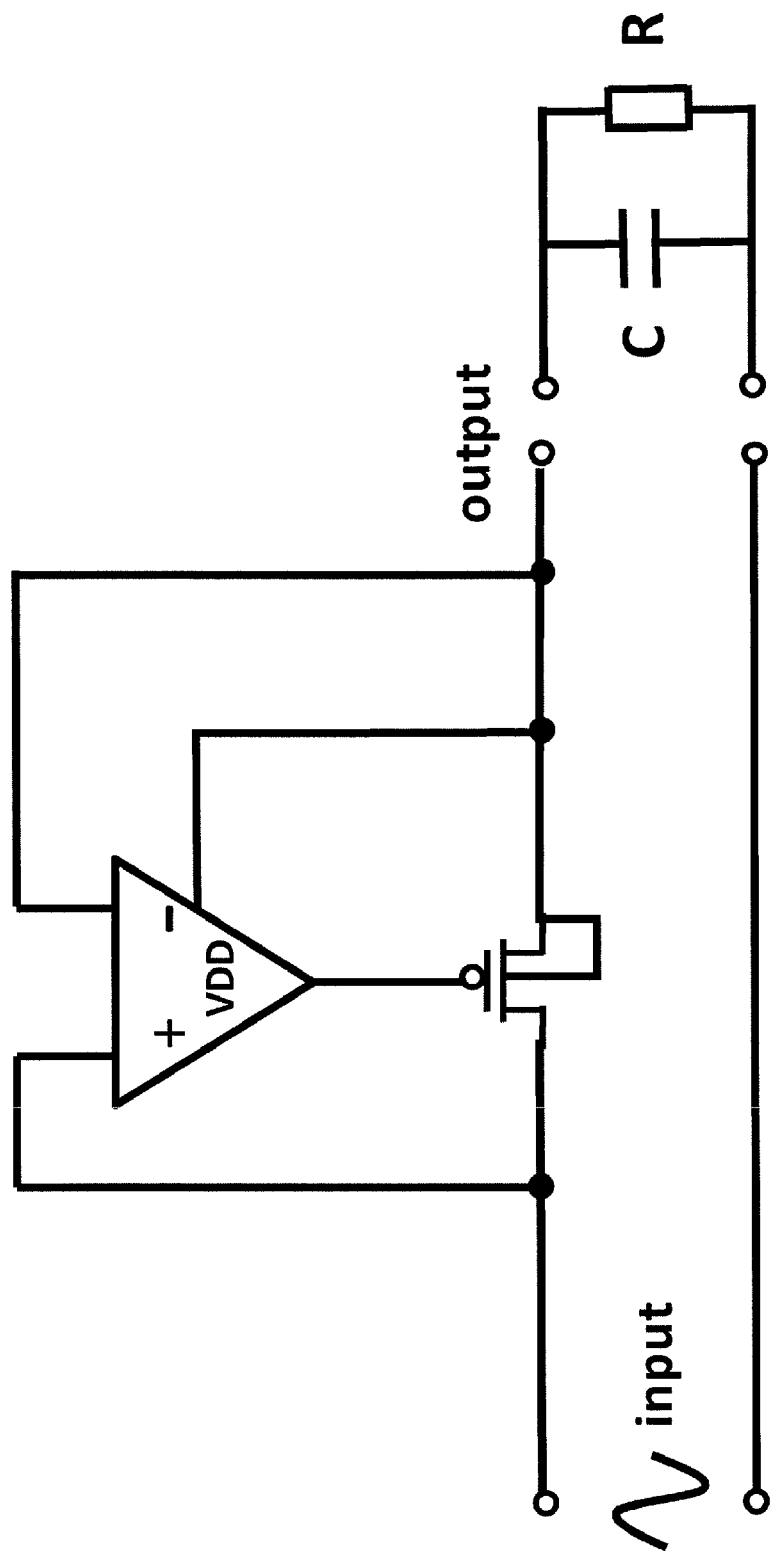
FIG. 4B shows a schematic of a specific embodiment of an output-powered active diode circuit.
Figure 5A:
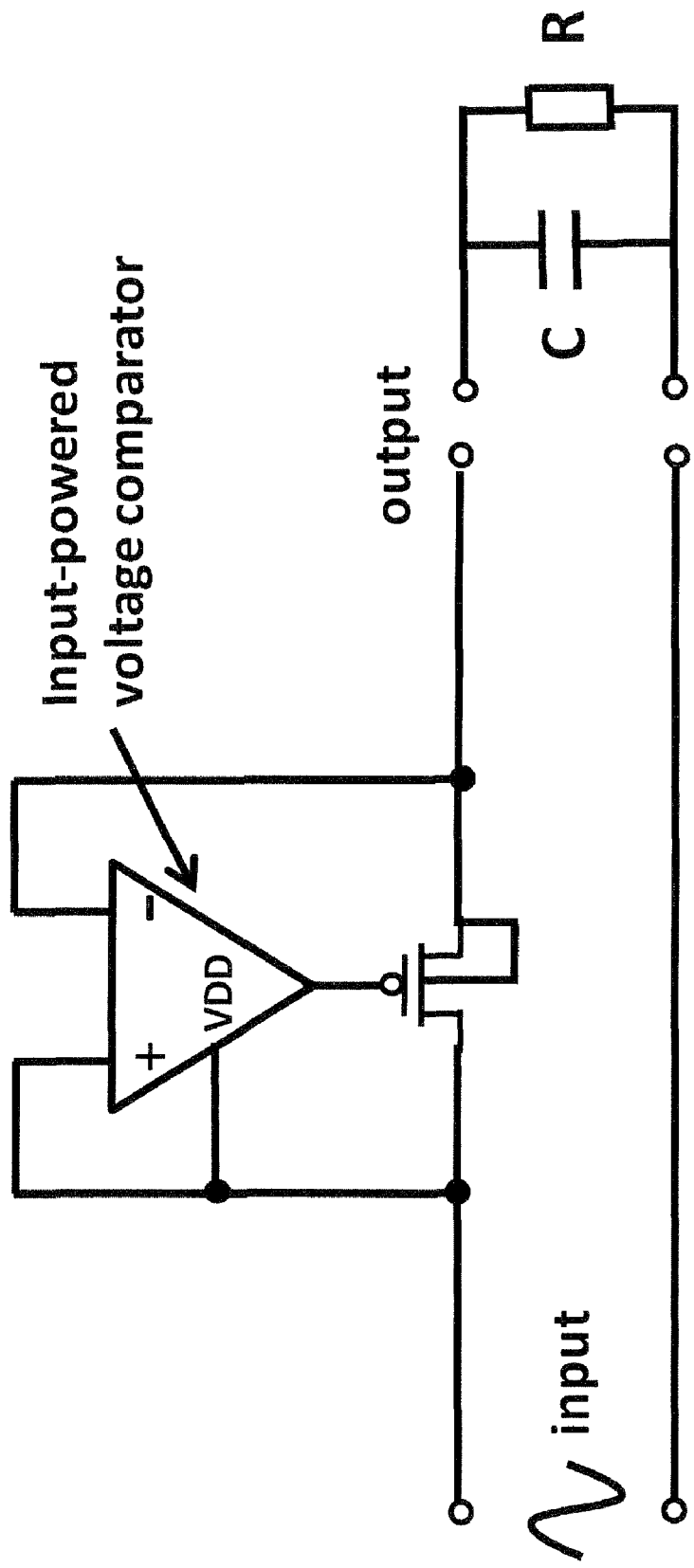
FIG. 5A shows a schematic of an input-powered active diode circuit in accordance with an embodiment of the subject invention.

FIG. 4A and FIG. 4B show commonly used active diodes. The comparators are either powered by, for example, an external power supply or an output storage capacitor. As shown in FIG. 5A, embodiments of the invention can use the input as the power supply for the comparator.

Figure 5B:
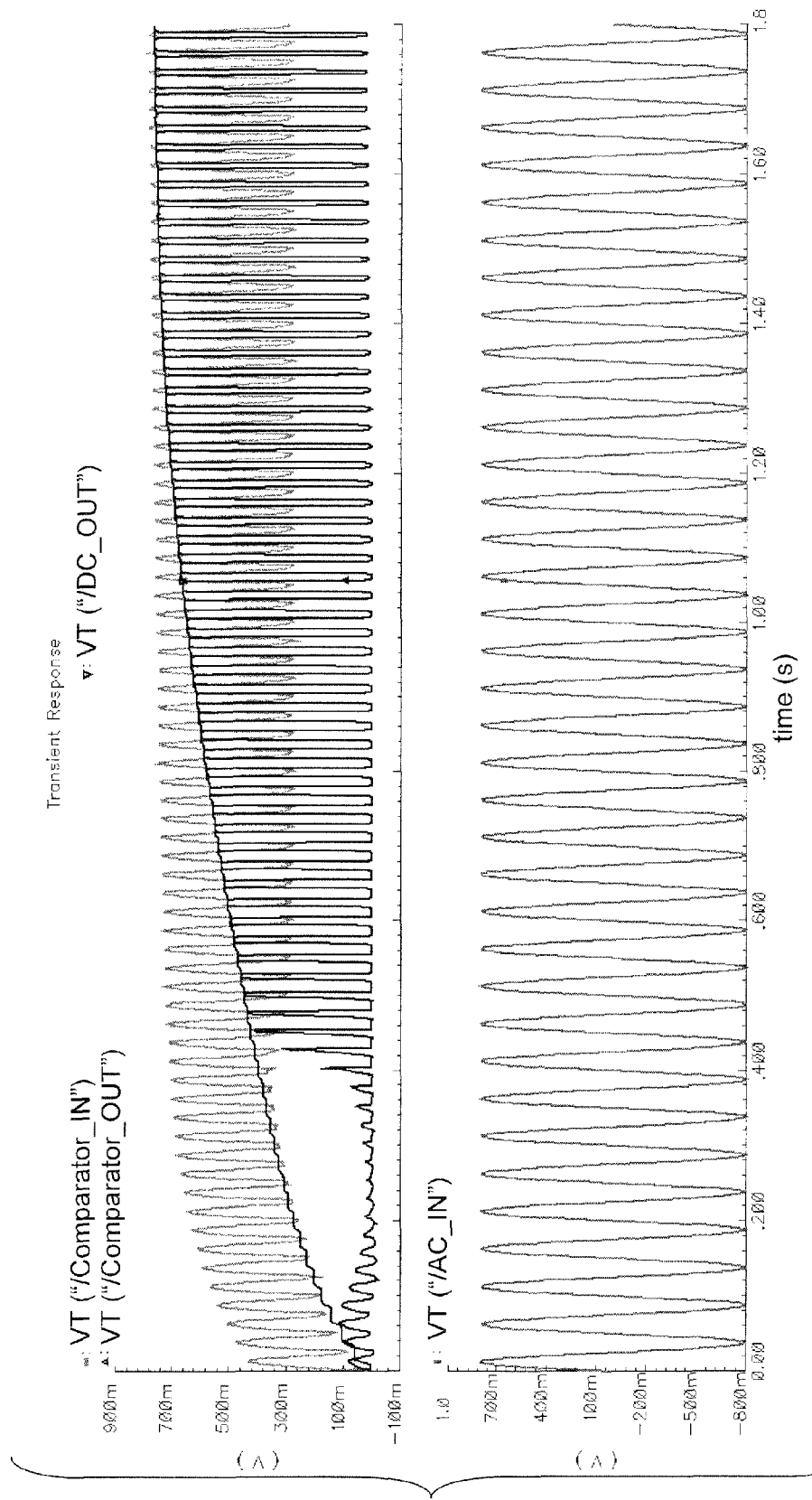
FIG. 5B shows simulation results for the circuitry of FIG. 5A.

For a specific embodiment for use with an energy harvester, the circuitry for an input-powered active diode is shown in FIG. 5A. Referring to FIG. 5A, the comparator and the CMOS transistor, taken together, can be considered an active diode. Simulation results for the circuitry of FIG. 5A is shown in FIG. 5B. Referring to FIG. 5A, the energy harvester can connect to the input at the left, which connects to the V+ pin of the comparator. The energy harvester also connects to the source of the CMOS transistor, which functions as a switch to allow power to be delivered from the energy harvester to the energy storage element. The switch can be, for example, a BJT transistor, a JFET transistor, or an analog switch. The drain of the CMOS transistor is connected to the energy storage element and to the V− pin of the comparator. The energy storage element is represented on the right of the FIG. 5A as a capacitor, C, in parallel with resistor, R. The output, Vout, of the comparator is connected to the gate of the CMOS transistor (switch) and turns the CMOS transistor on when Vout is low, allowing power to flow from the energy harvester to the energy storage element. Other transistors can be used instead of the CMOS transistor. In other embodiments, a CMOS transistor, or other transistor type, can be turned on when the voltage applied to the gate is high. In a further embodiment, a transistor that turns on with a high voltage applied to the gate can be used and an inverter can be introduced between the output of the comparator, Vout, and the gate of the transistor.

Accordingly, when the energy harvester has a voltage (V+) above the voltage of the energy storage element (V−), Vout is low, thus turning on the CMOS transistor (switch) and allowing power to flow from the energy harvester to the energy storage element. Advantageously, when the energy harvester voltage is higher than the energy storage element voltage, the comparator is powered by the energy harvester, and when the energy harvester voltage is lower than the energy storage element voltage, the comparator does not use any power. In particular, when the energy harvester voltage is higher than the energy storage element voltage, the first stage of the comparator is powered by the energy harvester.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed:

1. An energy harvester system, comprising:
   an energy harvesting module;
   an energy storage element;
   a comparator wherein the comparator comprises:
      a first input connector;
      a second input connector;
      an input power connector; and
      an output connector, wherein the comparator is connected to the energy harvesting module via the first input connector, wherein the comparator is connected to the energy storage element via the second input connector, and wherein the input power connector is connected to the energy harvesting module such that the comparator is powered by the energy harvesting module when a first voltage applied to the first input connector by the energy harvesting module is higher than a threshold voltage, wherein the output connector outputs an output voltage,
   a switch transistor, wherein the switch transistor comprises a gate, a switch input, and a switch output, wherein the output connector is connected to the gate of the switch transistor, wherein the energy harvesting module is connected to the switch input, and wherein the energy storage element is connected to the switch output;
   wherein when the first voltage is higher than a second voltage applied to the second input connector by the energy storage element, the output voltage connected to the gate of the transistor allows power to flow from the energy harvesting module to the energy, and wherein the comparator only consumes power when the first voltage is higher than the threshold voltage.

2. The energy harvester system according to claim 1, wherein the switch input is a source of the switch transistor, wherein the switch output is a drain of the switch transistor.

3. The energy harvester system according to claim 1, wherein the switch transistor is a CMOS transistor.

4. The energy harvester system according to claim 1, wherein the output voltage at the output connector connected to the gate allows power to flow from the energy harvesting module to the energy storage element by turning on the switch transistor.

5. The energy harvester system according to claim 1, wherein the first input connector is a positive input connector and the second input connector is a negative input connector.

6. The energy harvester system according to claim 1, wherein the comparator comprises a plurality of CMOS transistors, wherein the threshold voltage is a threshold voltage of the plurality of CMOS transistors.

7. An active diode, comprising:
   a comparator; and
   a transistor switch having a gate, a switch input, and a switch output, wherein the comparator comprises,
   a first input connector,
   a second input connector,
   an output connector, and
   an input power connector, wherein the output connector is connected to the gate, wherein the comparator is adapted to connect to a first voltage source via the first input connector, wherein the comparator is adapted to connect to a second voltage source via the second input connector, wherein the comparator is adapted to connect to the first voltage source via the input power connector, wherein the comparator is powered by the first voltage source via the input power connector when a first voltage of the first voltage source is higher than a threshold voltage, wherein when the first voltage source is connected to the switch input, the second input connector is connected to the switch output, and the first voltage of the first voltage source is higher than a second voltage of the second voltage source, an output voltage at the output connector connected to the gate of the transistor allows power to flow from the first voltage source to the, and wherein the comparator only consumes power when the first voltage of the first voltage source is higher than the threshold voltage.

8. The active diode according to claim 7, wherein the switch transistor is a CMOS transistor.

9. The active diode according to claim 7, wherein the switch input is a source of the switch transistor, wherein the switch output is a drain of the switch transistor.

10. The active diode according to claim 7, wherein the output voltage at the output connector connected to the gate allows power to flow from the first voltage source to the switch output by turning on the switch transistor.

11. The active diode according to claim 7, wherein the first input connector is a positive input connector and the second input connector is a negative input connector.

12. The energy harvester system according to claim 7, wherein the comparator comprises a plurality of CMOS transistors, wherein the threshold voltage is a threshold voltage of the plurality of CMOS transistors.

* * * * *

UNITED STATES PATENT AND TRADEMARK OFFICE
CERTIFICATE OF CORRECTION

PATENT NO. : 8,354,871 B2  
APPLICATION NO. : 12/942768  
DATED : January 15, 2013  
INVENTOR(S) : Yuan Rao Page 1 of 1

It is certified that error appears in the above-identified patent and that said Letters Patent is hereby corrected as shown below:

In the Claims:

Claim 7, Column 5 - Column 6,
Lines 21-1, "to the, and" should read --to the switch output, and--.

Signed and Sealed this
Second Day of July, 2013

Teresa Stanek Rea
*Acting Director of the United States Patent and Trademark Office*